(12) United States Patent
Kim

(10) Patent No.: US 12,154,882 B2
(45) Date of Patent: Nov. 26, 2024

(54) SOLDER REFLOW APPARATUS AND METHOD OF MANUFACTURING AN ELECTRONIC DEVICE

(71) Applicant: SAMSUNG ELECTRONICS CO., LTD., Suwon-si (KR)

(72) Inventor: Youngja Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 53 days.

(21) Appl. No.: 18/126,858

(22) Filed: Mar. 27, 2023

(65) Prior Publication Data
US 2024/0047410 A1 Feb. 8, 2024

(30) Foreign Application Priority Data
Aug. 3, 2022 (KR) .................. 10-2022-0096842

(51) Int. Cl.
*B23K 3/00* (2006.01)
*B23K 1/00* (2006.01)
(Continued)

(52) U.S. Cl.
CPC ............ *H01L 24/75* (2013.01); *B23K 1/0016* (2013.01); *B23K 1/015* (2013.01); *B23K 3/047* (2013.01);
(Continued)

(58) Field of Classification Search
CPC ...... B23K 3/08; B23K 2101/36; B23K 1/008; B23K 2101/42; B23K 3/00; B23K 3/04; B23K 1/0016; B23K 1/015; B23K 3/047; B23K 3/087; B23K 2101/40; H05K 3/3494; H01L 2224/81024; H01L 2224/81092; H01L 2224/81095; H01L 2224/81211; H01L 2224/81395; H01L 2224/81815; H01L 2224/81908; H01L 2224/95092;
(Continued)

(56) References Cited

U.S. PATENT DOCUMENTS 2,943,181 A * 6/1960 Gunow .................. B23K 35/38
228/217
4,580,716 A * 4/1986 Barresi ................ B23K 35/386
228/180.1
(Continued)

FOREIGN PATENT DOCUMENTS

CN 101530954 A * 9/2009 ........... B23K 1/0014
CN 107838516 A * 3/2018 ............. B23K 1/008
(Continued)

*Primary Examiner* — Kiley S Stoner
(74) *Attorney, Agent, or Firm* — Sughrue Mion, PLLC

(57) ABSTRACT

A solder reflow apparatus includes a vapor generating chamber configured to accommodate a heat transfer fluid and to accommodate saturated vapor generated by heating the heat transfer fluid; a heater configured to heat the heat transfer fluid accommodated in the vapor generating chamber; a substrate stage configured to be movable upward and downward within the vapor generating chamber, the substrate stage including a seating surface; vapor passages penetrating the substrate stage and configured to allow the vapor to move therethrough; and suction passages penetrating the substrate stage to be open to the seating surface and in which at least a partial vacuum is generated.

20 Claims, 16 Drawing Sheets

(51) Int. Cl.
  *B23K 1/015* (2006.01)
  *B23K 3/047* (2006.01)
  *B23K 3/08* (2006.01)
  *H01L 23/00* (2006.01)
  *B23K 101/40* (2006.01)
  *H01L 21/56* (2006.01)

(52) U.S. Cl.
  CPC .............. *B23K 3/087* (2013.01); *H01L 24/81* (2013.01); *H01L 24/97* (2013.01); *B23K 2101/40* (2018.08); *H01L 21/561* (2013.01); *H01L 24/13* (2013.01); *H01L 24/16* (2013.01); *H01L 2224/13111* (2013.01); *H01L 2224/13139* (2013.01); *H01L 2224/13147* (2013.01); *H01L 2224/16227* (2013.01); *H01L 2224/75272* (2013.01); *H01L 2224/75804* (2013.01); *H01L 2224/759* (2013.01); *H01L 2224/7598* (2013.01); *H01L 2224/75984* (2013.01); *H01L 2224/81024* (2013.01); *H01L 2224/81092* (2013.01); *H01L 2224/81095* (2013.01); *H01L 2224/81211* (2013.01); *H01L 2224/81395* (2013.01); *H01L 2224/81815* (2013.01); *H01L 2224/81908* (2013.01); *H01L 2224/95092* (2013.01); *H01L 2224/97* (2013.01); *H01L 2924/014* (2013.01); *H01L 2924/20104* (2013.01); *H01L 2924/20105* (2013.01); *H01L 2924/20106* (2013.01)

(58) Field of Classification Search
  CPC ........... H01L 2224/97; H01L 2924/014; H01L 2924/20104; H01L 2924/20105; H01L 2924/20106; H01L 2224/75101; H01L 2224/75251; H01L 2224/75824; H01L 2224/8121; H01L 23/3121; H01L 24/75; H01L 24/81; H01L 24/97; H01L 21/561; H01L 24/13; H01L 24/16; H01L 2224/13111; H01L 2224/13139; H01L 2224/13147; H01L 2224/16227; H01L 2224/75272; H01L 2224/75804; H01L 2224/759; H01L 2224/7598; H01L 2224/75984
  USPC ........... 228/234.2, 49.5, 44.7, 179.1–180.22, 228/218–221, 42
  See application file for complete search history.

(56) References Cited

U.S. PATENT DOCUMENTS

| | | | | |
|---|---|---|---|---|
| 4,612,712 A | * | 9/1986 | Pescatore | B23K 1/015 228/180.1 |
| 4,628,616 A | | 12/1986 | Shirai et al. | |
| 4,703,566 A | | 11/1987 | Kwoka | |
| 4,735,001 A | * | 4/1988 | Mishina | B23K 1/015 118/729 |
| 5,038,496 A | * | 8/1991 | Mishina | B23K 1/015 34/78 |
| 5,146,694 A | * | 9/1992 | Mishina | B23K 1/015 432/19 |
| 5,623,123 A | * | 4/1997 | Umehara | H01L 23/49503 29/841 |
| 6,742,701 B2 | | 6/2004 | Furuno et al. | |
| 7,748,600 B2 | | 7/2010 | Leicht | |
| 8,381,966 B2 | | 2/2013 | Kumar et al. | |
| 9,673,061 B2 | | 6/2017 | Huang | |
| 2003/0207213 A1 | * | 11/2003 | Farnworth | G03F 7/0037 430/315 |
| 2004/0178251 A1 | * | 9/2004 | Trucco | H05K 3/3485 228/248.1 |
| 2007/0057020 A1 | * | 3/2007 | Shibamura | B23K 3/08 228/101 |
| 2009/0230176 A1 | * | 9/2009 | Takahashi | B23K 26/0676 228/256 |
| 2010/0012705 A1 | * | 1/2010 | Nakamura | B23K 1/0016 228/19 |
| 2010/0012709 A1 | * | 1/2010 | Nikaido | B23K 3/08 228/19 |
| 2013/0175323 A1 | * | 7/2013 | Zhang | B23K 1/206 228/4.1 |

FOREIGN PATENT DOCUMENTS

| | | | | |
|---|---|---|---|---|
| CN | 107855622 A | * | 3/2018 | ............ B23K 1/008 |
| CN | 107855623 A | * | 3/2018 | .......... B23K 1/0016 |
| CN | 107931768 A | * | 4/2018 | .......... B23K 1/0016 |
| CN | 107963443 A | * | 4/2018 | .......... B23K 1/0016 |
| CN | 106029276 B | * | 3/2019 | ............ B01D 46/30 |
| CN | 110385497 A | * | 10/2019 | |
| CN | 113613408 A | * | 11/2021 | |
| CN | 114147313 A | * | 3/2022 | |
| CN | 115332892 A | * | 11/2022 | |
| DE | 4404263 B4 | * | 12/2007 | ............ B23K 1/008 |
| DE | 202009014591 U1 | * | 3/2010 | .......... B23K 1/0016 |
| EP | 0145969 A2 | * | 6/1985 | |
| EP | 0218391 A1 | * | 4/1987 | |
| EP | 0757386 A2 | * | 2/1997 | |
| EP | 1036626 A2 | * | 9/2000 | ............ B23K 1/015 |
| EP | 3791946 A1 | | 3/2021 | |
| EP | 3851235 A1 | * | 7/2021 | ............ B23K 1/015 |
| JP | 2509935 B2 | * | 6/1996 | ............ B23K 1/015 |
| JP | H11163036 A | * | 6/1999 | |
| JP | 2003037345 A | * | 2/2003 | ............ H01L 24/97 |
| JP | 2007273571 A | * | 10/2007 | ............ B23K 1/008 |
| JP | 2007329376 A | * | 12/2007 | .......... B23K 1/0016 |
| JP | 2021-154334 A | | 10/2021 | |
| KR | 20020061482 A | * | 7/2002 | |
| TW | 201110295 A | * | 3/2011 | .......... B23K 1/0008 |
| TW | 201428867 A | * | 7/2014 | .......... B23K 3/0623 |
| WO | WO-9726107 A1 | * | 7/1997 | ............ B23K 1/008 |
| WO | WO-03106093 A2 | * | 12/2003 | ............ B23K 1/015 |
| WO | WO-2012070264 A1 | * | 5/2012 | .......... B23K 1/0016 |
| WO | WO-2016104710 A1 | * | 6/2016 | ............ B23K 1/002 |

* cited by examiner

SOLDER REFLOW APPARATUS AND METHOD OF MANUFACTURING AN ELECTRONIC DEVICE

CROSS-REFERENCE TO RELATED APPLICATION

This application claims priority to Korean Patent Application No. 10-2022-0096842, filed on Aug. 3, 2022 in the Korean Intellectual Property Office, the contents of which are incorporated by reference herein in their entirety.

BACKGROUND

1. Field

One or more example embodiments of the disclosure relate to a solder reflow apparatus and a method of manufacturing an electronic device using the same, and more particularly, to a solder reflow apparatus using a vapor phase soldering method and a method of manufacturing a semiconductor package using the same.

2. Description of the Related Art

A convection reflow method, a laser assisted bonding method, a vapor phase soldering method, or the like may be used to solder a solder paste in the field of surface mount technology (SMT). In case of the vapor phase soldering method, it may be possible to provide a more uniform temperature distribution over the entire substrate including, but not limited to, a printed circuit board (PCB) during saturation of vapor inside an oven, and because the boiling point of a heat transfer fluid is predetermined, there are advantages of preventing overheating by setting the target temperature high.

However, when performing a solder reflow process according to the vapor phase soldering method, as a pitch between solders is miniaturized, it becomes more and more difficult to transfer heat more uniformly over the entire area while firmly fixing the substrate in order to prevent bonding defects.

SUMMARY

One or more example embodiments provide a solder reflow apparatus capable of efficiently performing a solder reflow process by transferring heat more uniformly across the entire substrate while firmly supporting the substrate.

Further, one or more example embodiments provide a method of manufacturing an electronic device using the above solder reflow apparatus.

According to an aspect of an example embodiment, a solder reflow apparatus includes: a vapor generating chamber configured to accommodate a heat transfer fluid and to accommodate saturated vapor generated by heating the heat transfer fluid; a heater configured to heat the heat transfer fluid accommodated in the vapor generating chamber; a substrate stage configured to be movable upward and downward within the vapor generating chamber, the substrate stage including a seating surface; vapor passages penetrating the substrate stage and configured to allow the vapor to move therethrough; and suction passages penetrating the substrate stage to be open to the seating surface and in which at least a partial vacuum is generated.

According to an aspect of an example embodiment, a solder reflow apparatus includes: a vapor generating chamber configured to accommodate a heat transfer fluid; a heater configured to heat the heat transfer fluid to generate saturated vapor from the heat transfer fluid; a substrate stage configured to be movable upward and downward within the vapor generating chamber, the substrate stage including a seating surface that is configured to support a substrate on which an electronic component is mounted via a solder; vapor passages penetrating the substrate stage; and a suction support mechanism including: suction passages penetrating the substrate stage to be open to the seating surface; and a vacuum pump configured to generate at least a partial vacuum in the suction passages.

According to an aspect of an example embodiment, a solder reflow apparatus includes: a vapor generating chamber configured to accommodate a heat transfer fluid and to accommodate saturated vapor generated by heating the heat transfer fluid is heated; a heater configured to heat the heat transfer fluid accommodated in the vapor generating chamber; a substrate stage configured to be movable upward and downward within the vapor generating chamber, the substrate stage including: a seating surface; vapor passages penetrating the substrate stage and configured to allow the vapor to move through the vapor passages; and suction passages extending in the substrate stage to be open to the seating surface; and a fixing jig supported on the seating surface of the substrate stage and configured to support a substrate on which an electronic component is mounted via a solder.

BRIEF DESCRIPTION OF THE DRAWINGS

The above and/or other aspects will be more clearly understood from the following detailed description of example embodiment taken in conjunction with the accompanying drawings, in which.

DETAILED DESCRIPTION

Hereinafter, example embodiments will be explained in detail with reference to the accompanying drawings.

Figure 1:
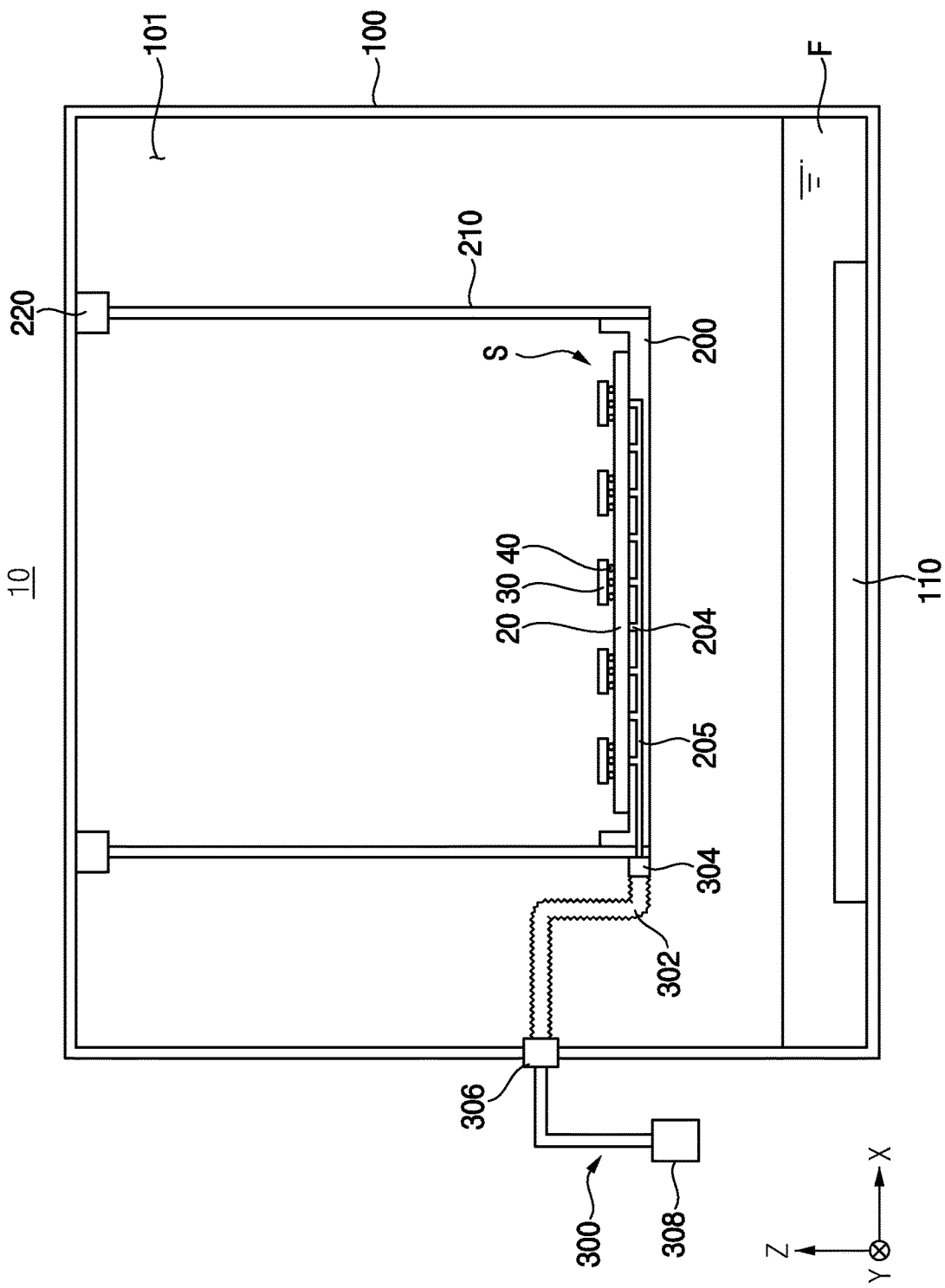
FIG. 1 is a cross-sectional view illustrating a solder reflow apparatus in accordance with example embodiments.
Figure 2:
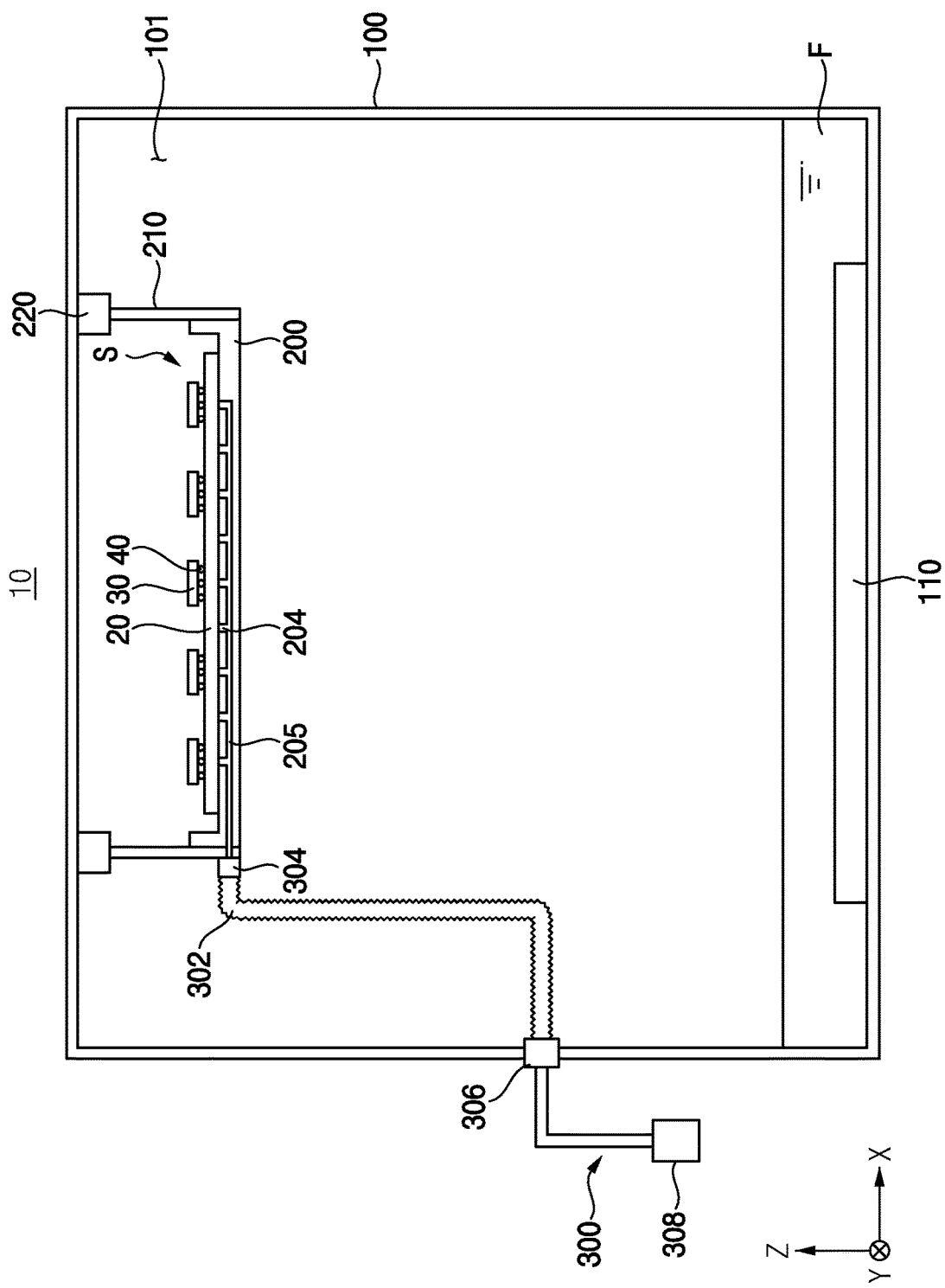
FIG. 2 is a cross-sectional view illustrating the solder reflow apparatus of FIG. 1, wherein a substrate stage is raised, according to an example embodiment.
Figure 3:
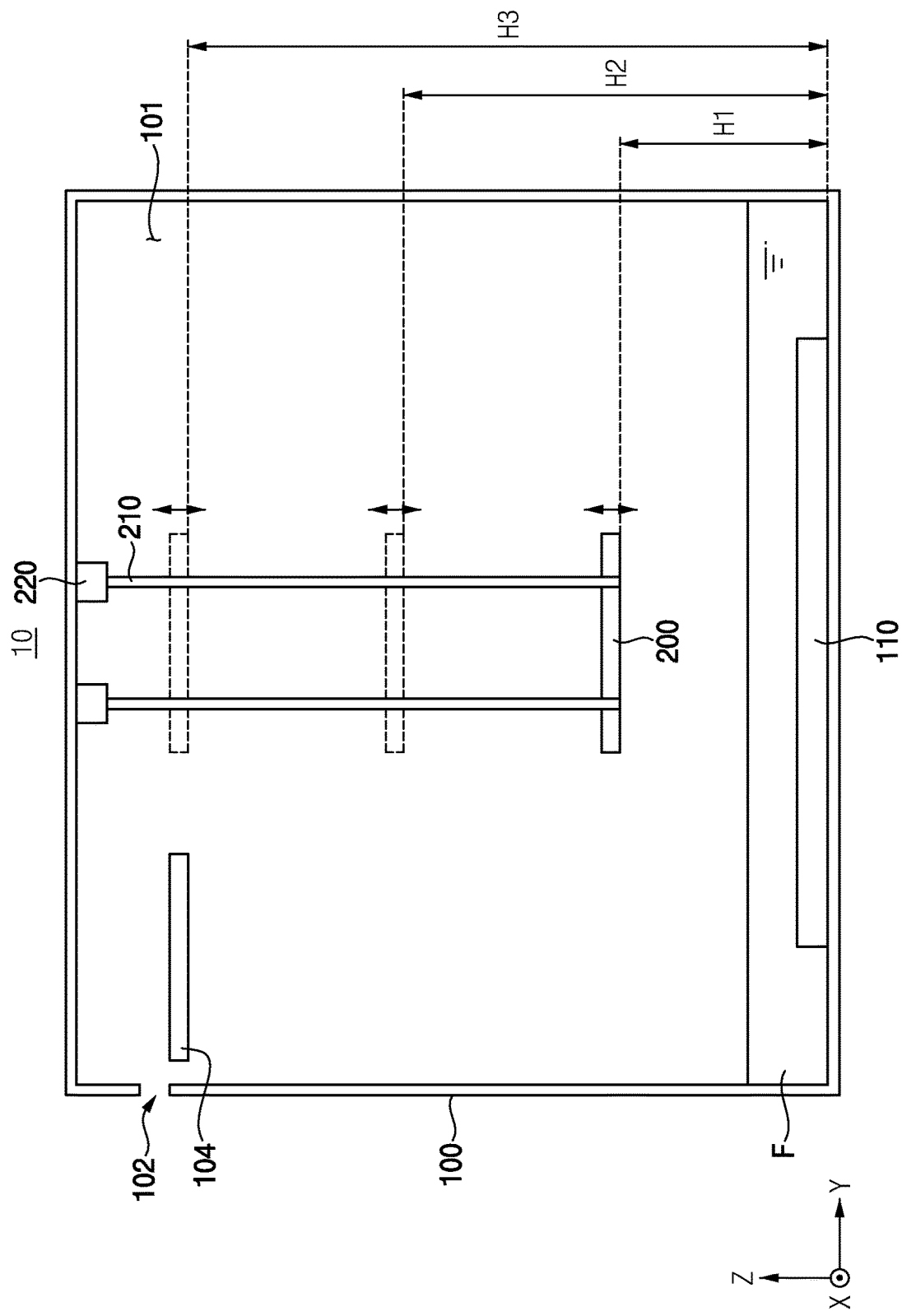
FIG. 3 is a side view illustrating the solder reflow apparatus of FIG. 1, according to an example embodiment.
Figure 4:
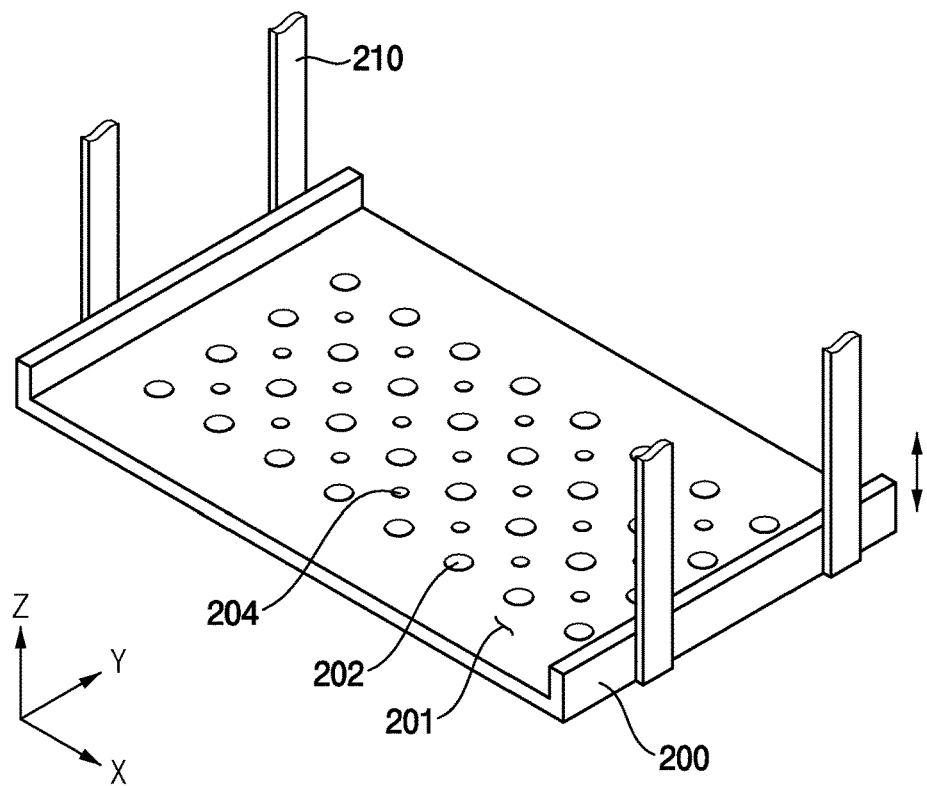
FIG. 4 is a perspective view illustrating the substrate stage of the solder reflow apparatus of FIG. 1, according to an example embodiment.
Figure 5:
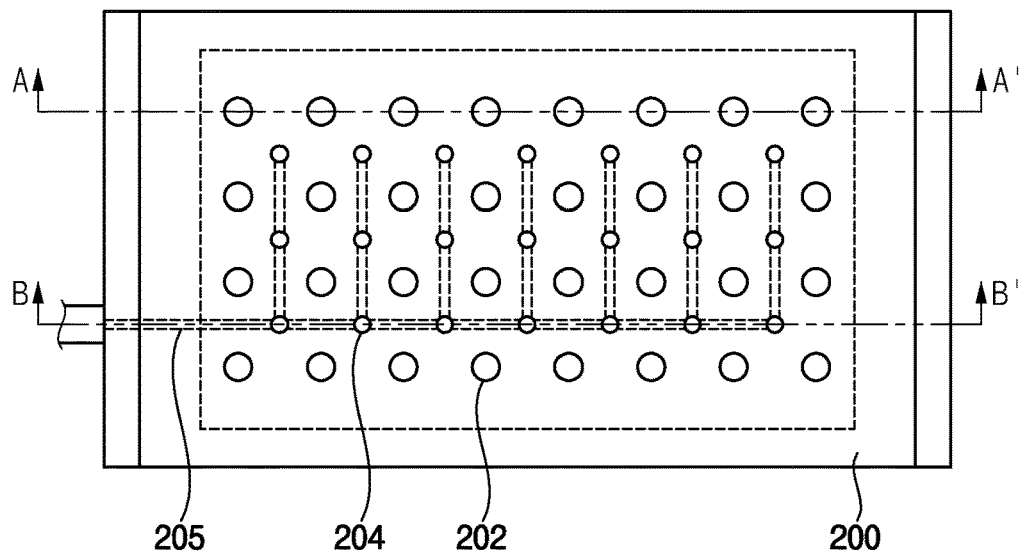
FIG. 5 is a perspective view illustrating an article supported on the substrate stage of FIG. 4, according to an example embodiment.
Figure 6:
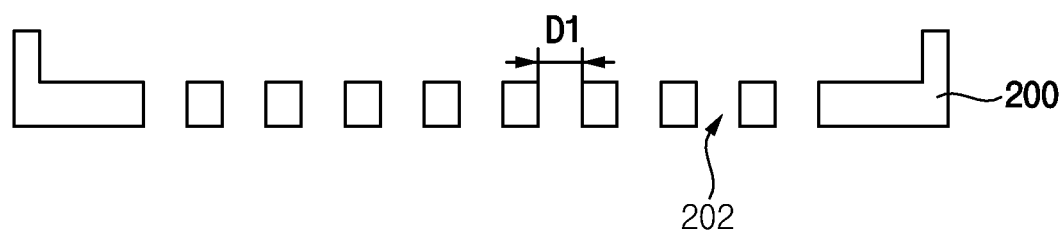
FIG. 6 is a cross-sectional view taken along the line A-A' in FIG. 5, according to an example embodiment.
Figure 7:
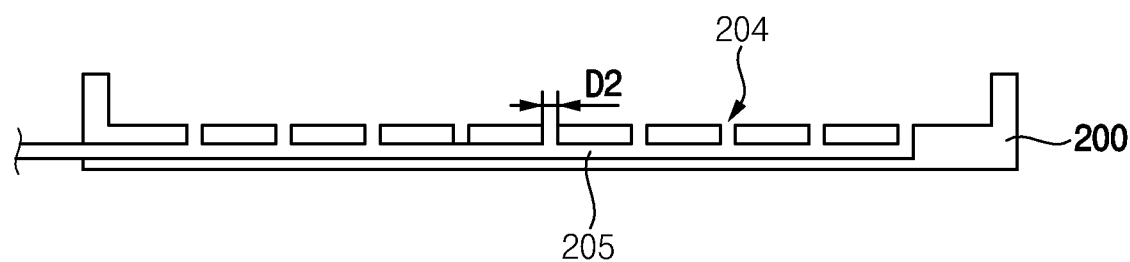
FIG. 7 is a cross-sectional view taken along the line B-B' in FIG. 5, according to an example embodiment.
Figure 8:
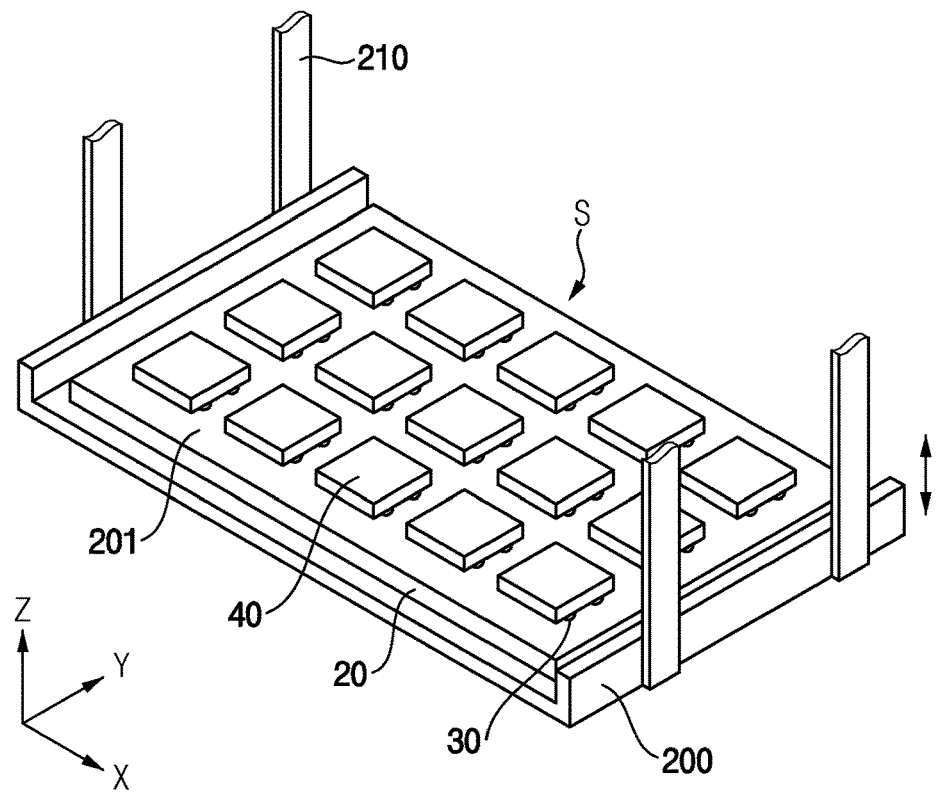
FIG. 8 is a perspective view illustrating an article supported on the substrate stage of FIG. 4, according to an example embodiment.
Figure 9:
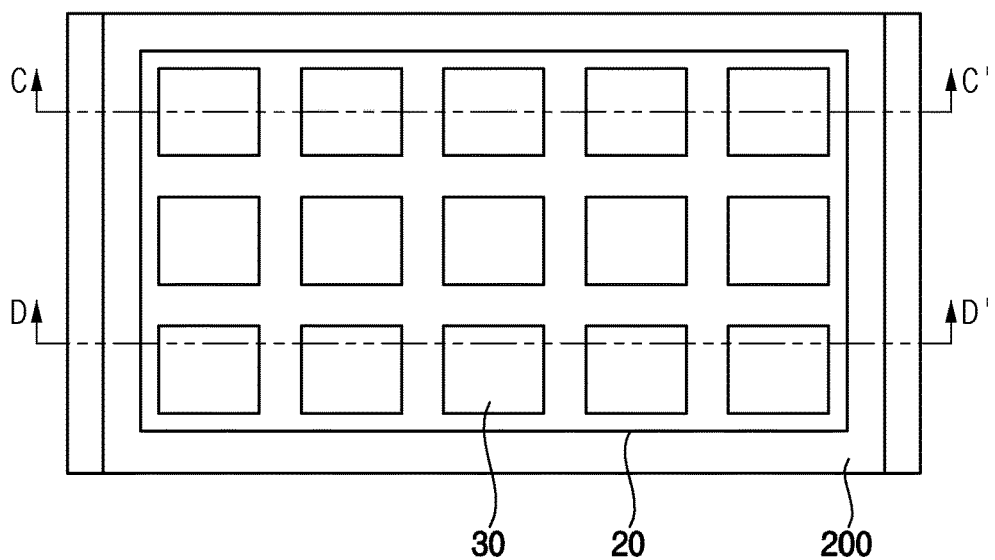
FIG. 9 is a plan view illustrating the article supported on the substrate stage of FIG. 8, according to an example embodiment.
Figure 10:
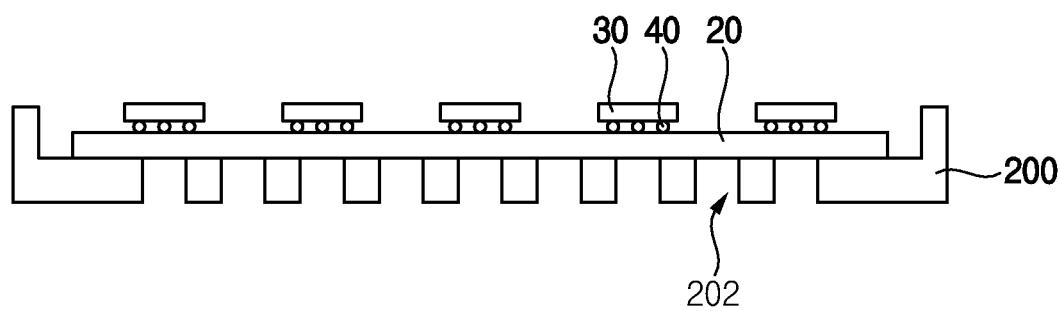
FIG. 10 is a cross-sectional view taken along the line C-C' in FIG. 9, according to an example embodiment.
Figure 11:
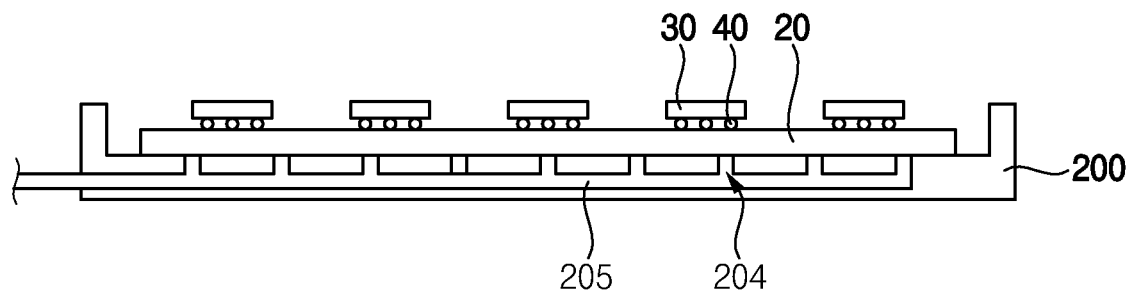
FIG. 11 is a cross-sectional view taken along the line D-D' in FIG. 9, according to an example embodiment.

FIG. 1 is a cross-sectional view illustrating a solder reflow apparatus in accordance with example embodiments. FIG. 2 is a cross-sectional view illustrating the solder reflow apparatus of FIG. 1, wherein a substrate stage is raised, according to an example embodiment. FIG. 3 is a side view illustrating the solder reflow apparatus of FIG. 1, according to an example embodiment. FIG. 4 is a perspective view illustrating the substrate stage of the solder reflow apparatus of FIG. 1, according to an example embodiment. FIG. 5 is a perspective view illustrating an article supported on the substrate stage of FIG. 4, according to an example embodiment. FIG. 6 is a cross-sectional view taken along the line A-A' in FIG. 5, according to an example embodiment. FIG. 7 is a cross-sectional view taken along the line B-B' in FIG. 5, according to an example embodiment. FIG. 8 is a perspective view illustrating an article supported on the substrate stage of FIG. 4, according to an example embodiment. FIG. 9 is a plan view illustrating the article supported on the substrate stage of FIG. 8, according to an example embodiment. FIG. 10 is a cross-sectional view taken along the line C-C' in FIG. 9, according to an example embodiment. FIG. 11 is a cross-sectional view taken along the line D-D' in FIG. 9, according to an example embodiment.

Referring to FIGS. 1, 2, 3, 4, 5, 6, 7, 8, 9, 10 and 11, according to an example embodiment, a solder reflow apparatus 10 may include a vapor generating chamber 100, a heater 110 and a substrate stage 200. In addition, the solder reflow apparatus 10 may further include a plurality of vapor passage holes 202 and a plurality of suction holes 204 formed in the substrate stage 200. In addition, the solder reflow apparatus 10 may further include a suction support mechanism 300 including a vacuum pump 308 configured to form at least partial vacuum in the suction holes 204. In addition, the solder reflow apparatus 10 may further include a lifting driver configured to raise and lower the substrate stage 200 and a temperature sensing portion configured to monitor temperature in the vapor generating chamber 100.

In example embodiments, the solder reflow apparatus 10 may be a vapor phase soldering apparatus configured to solder a solder paste using saturated vapor heated in the vapor generating chamber 100.

The vapor generating chamber 100 may include a lower reservoir having an oven shape to accommodate a heat transfer fluid F and to provide a space 101 filled with vapor that is generated directly above the heat transfer fluid F when the heat transfer fluid F is boiling. The vapor generating chamber 100 may extend in a vertical direction (Z direction) by a predetermined height. In the vapor generating chamber 100, the heat transfer fluid F may boil, the vapor may rise to the top, the vapor may condense back to the liquid state at the top, and then may flow back to the reservoir at the bottom.

The pressure inside the vapor generating chamber 100 may be maintained at atmospheric pressure. Alternatively, the vapor generating chamber 100 may be connected to an exhaust device including, but not limited to, a vacuum pump to adjust the pressure inside the vapor generating chamber 100. The pressure inside the vapor generating chamber may be maintained at a predetermined pressure in order to change the boiling point of the heat transfer fluid F or to change soldering environments.

The heat transfer fluid F may be a chemical material that is selected to provide the vapor necessary for vapor phase soldering. The heat transfer fluid F may be selected in consideration of any one or more of boiling point, environmental influences, and corrosiveness of the generated vapor. The heat transfer fluid F may include, but is not limited to, an inert organic liquid. For example, the heat transfer fluid F may include, but is not limited to, a perfluoropolyether (PFPEs)-based Galden solution. The boiling point of the Galden solution may be 230° C.

The heater 110 may heat the heat transfer fluid F accommodated in the vapor generating chamber 100 to generate saturated vapors. The heater 110 may include, but is not limited to, an electrical resistor that is immersed in the heat transfer fluid F on the bottom of the vapor generating chamber 100. Alternatively, the heater 110 may include, but is not limited to, a resistor in the form of a coil surrounding the reservoir tank.

In addition, another heater as a portion of a temperature control mechanism may be installed on a sidewall of the vapor generating chamber 100 to control the temperature of the vapor generating chamber 100 during a reflow process.

As illustrated in FIGS. 2 and 3, according to an example embodiment, the substrate stage 200 may be installed to be movable upward and downward within the vapor generating chamber 100. The lifting driver for moving the substrate stage 200 upward and downward may include, but is not limited to, various types of actuators including, but not limited to, a transfer rail, a transfer screw, a transfer belt, etc. Both end portions of the substrate stage 200 may be supported by transfer rods 210 respectively, and the substrate stage 200 may be moved up and down by the lifting driver.

As illustrated in FIGS. 4, 5, 6 and 7, according to an example embodiment, the substrate stage 200 may have a seating surface 201 for supporting an article S on which a solder process is performed in the vapor generating chamber 100. The substrate stage 200 may include a plurality of the vapor passage holes 202 that are formed to penetrate the substrate stage 200 to allow vapor movement and a plurality of the suction holes 204 that extend to be open to the seating surface 201. The vapor passage holes 202 and the suction holes 204 may have circular or polygonal shapes. The substrate stage 200 may include, but is not limited to, a mesh type support structure having the vapor passage holes 202. The vapor passage holes 202 may have a diameter D1 of a first size, and the suction holes 204 may have a diameter D2 of a second size smaller than the first size. The sizes and shapes of the vapor passage holes 202, the arrangements of the vapor passage holes 202, etc. may be determined in consideration of, among other things, the temperature profile in the vapor generating chamber.

The substrate stage 200 may include an exhaust line 205 in communication with the suction holes 204. The exhaust line 205 may extend within the substrate stage 200 and may communicate with the suction holes 204. The suction support mechanism 300 may include a vacuum pump 308 that is connected to the exhaust line 205 and forms at least a partial vacuum in the suction holes 204. The suction support mechanism 300 may further include an expandable pipe 302 that is disposed within the vapor generating chamber 100 and connects the exhaust line 205 and the vacuum pump 308 to each other. For example, the expandable pipe 302 may include, but is not limited to, bellows. One end of the expandable pipe 302 may be connected to one end of the exhaust line 205 by a first sealed connection member 304. The other end of the expandable pipe 302 may be connected to an exhaust pipe connected to the vacuum pump 308 by a second sealed connection member 306.

As illustrated in FIGS. 8, 9, 10 and 11, according to an example embodiment, the article S for soldering may be supported on the seating surface 201 of the substrate stage 200. For example, the article S may include a substrate 20 on which an electronic component 30 is mounted via a solder 40. A lower surface of the substrate 20 may be exposed by the vapor passage holes 202 that penetrate the substrate stage 200. The lower surface of the substrate 20 may be in contact with the suction holes 204 that are opened in the seating surface 201.

The vacuum pump 308 may be connected to the suction holes 204 by the exhaust line 205 to form at least partial vacuum in the suction holes 204. When the vacuum pump 308 sucks air from the suction holes 204, the substrate 20 may be suction-supported on the seating surface 201 by at least partial vacuum formed in the suction holes 204. At this time, the vapor under the substrate stage 200 may move through the vapor passage holes 202 of the substrate stage 200 and the vapor may be brought into contact with a lower surface of the substrate 20. Accordingly, the vapor may be sufficiently supplied to the lower surface of the substrate 20 to achieve more uniform heat transfer over the entire area of the article S.

As illustrated in FIG. 3, according to an example embodiment, the article S for soldering may be transferred into the vapor generating chamber 100 through a gate 102 of the vapor generating chamber 100, and the article S may be loaded on the substrate stage 200 by a transfer mechanism 104 including, but not limited to, a guide rail or a transport pusher.

After the article S is loaded, the Galden solution of the transfer fluid F may be heated by the heater 110 and start to boil. The saturated vapor from the Galden solution may be distributed within the space 101 of the vapor generating chamber 100. At this time, the density of the saturated vapor may vary depending on the height, and thus a temperature gradient may be formed.

For example, the temperature T1 of the vapor generating chamber at a third height H3 may be 100° C., the temperature T2 of the vapor generating chamber at a second height H2 may be 170° C., and the temperature T3 of the vapor generating chamber at a first height H1 may be 230° C. The solder 40 may include, but is not limited to, Sn—Ag—Cu (SAC) solder, Sn—Ag solder, etc. Because the boiling point of the SAC solder is 217° C., the temperature T3 at the first height H1, which is a reflow section, may be maintained at 230° C.

Hereinafter, a method of performing a vapor phase reflow process using the solder reflow apparatus of FIG. 1, according to an example embodiment, will be described.

First, an article S for soldering may be loaded into the vapor generating chamber 100, and the heat transfer fluid F in the vapor generating chamber 100 may be heated.

In example embodiments, a substrate 20 on which an electronic component 30 is mounted via a solder 40 may be transferred into the vapor generating chamber 100 through the gate 102 of the vapor generating chamber 100, and then, the article S may be loaded on the substrate stage 200 by the transfer mechanism 104 including, but not limited to, a guide rail or a transfer pusher.

After the article S is loaded onto the substrate stage 200, the vacuum pump 308 may be connected to the suction holes 204 by the exhaust line 205 to form at least partial vacuum in the suction holes 204. When the vacuum pump 308 sucks air from the suction holes 204, the substrate 20 may be suction-supported on the seating surface 201 by at least partial vacuum formed in the suction holes 204.

After the article S is suction-supported on the substrate stage 200, the Galden solution of the transfer fluid F may be heated by the heater 110 and start to boil. The saturated vapor from the Galden solution may be distributed within the space 101 of the vapor generating chamber 100. At this time, the vapor may have a density gradient according to the height, and thus, a temperature gradient along the vertical direction within the vapor generating chamber 100 may be formed.

After the article S is preheated at the third height H3, the article may be moved to the second height H2 and activated (soaked). The substrate 20 may be preheated, for example, to prevent various soldering defects and to provide a more solid and conductive joint. There may be a secondary vapor phase which is produced at a cooler temperature than the main vapor layer at the third and second heights H3 and H2. According to an example embodiment, no soldering takes place at the second height H2, but a temperature increases at the second height H2 compared to the third height H3.

The article S may be moved to the first height H1 so that the solder 40 may be reflowed. When the article S is immersed in the vapor at the first height H1, the vapor may serves as a heat transfer medium. Because the temperature of the vapor and the temperature of the substrate 20 at the first height H1 are different from each other, vapor may condense on a surface of the article S to form a layer. The vapor condensing on the surface of the article S may transfer latent heat to the surface of the substrate 20 during condensation to reflow a solder paste.

At this time, the vapor under the substrate stage 200 may move through the vapor passage holes 202 of the substrate stage 200 to be supplied to the lower surface of the substrate 20. Accordingly, the vapor may be sufficiently supplied to the lower surface of the substrate 20 to achieve more uniform heat transfer over the entire area of the article S.

Then, after the solder 40 is soldered, the article S may be moved to the top of the chamber and then may be cooled. Accordingly, the solder joints may be cooled down and solidified.

Figure 12:
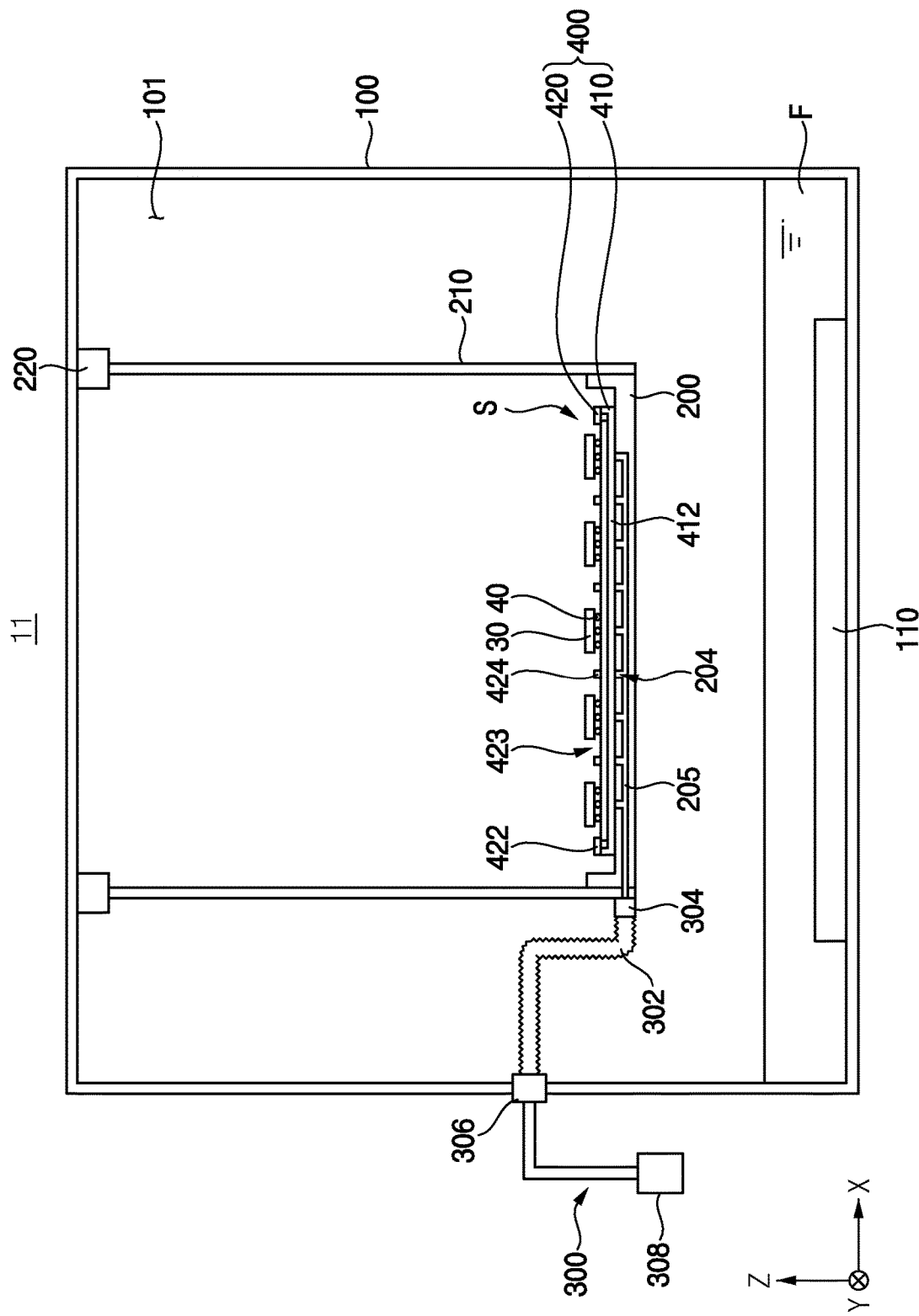
FIG. 12 is a cross-sectional view illustrating a solder reflow apparatus in accordance with example embodiments.
Figure 13:
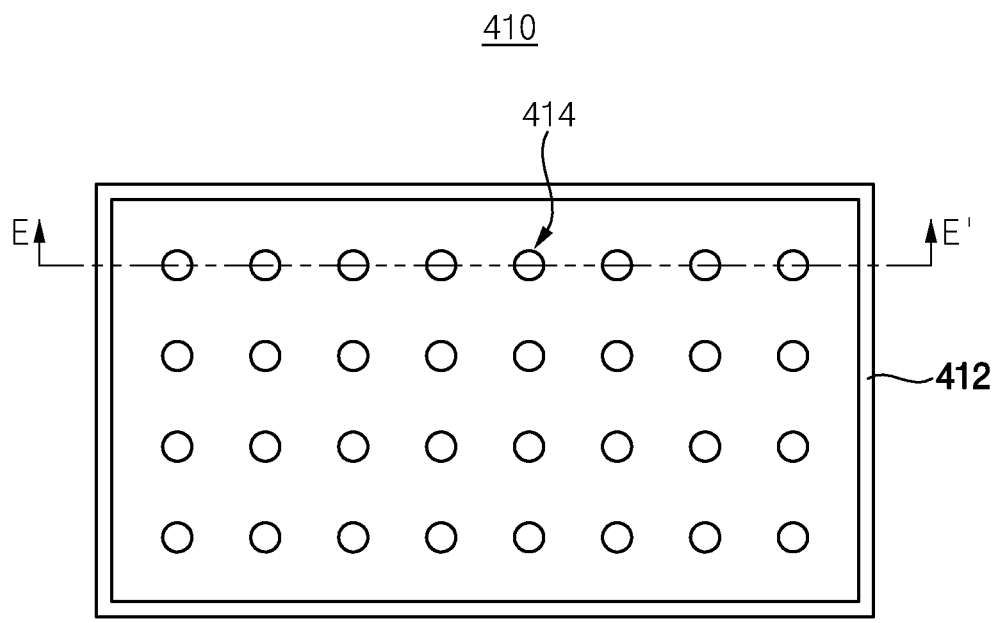
FIG. 13 is a plan view illustrating a lower jig of a fixing jig loaded into the solder reflow apparatus of FIG. 12, according to an example embodiment.
Figure 14:
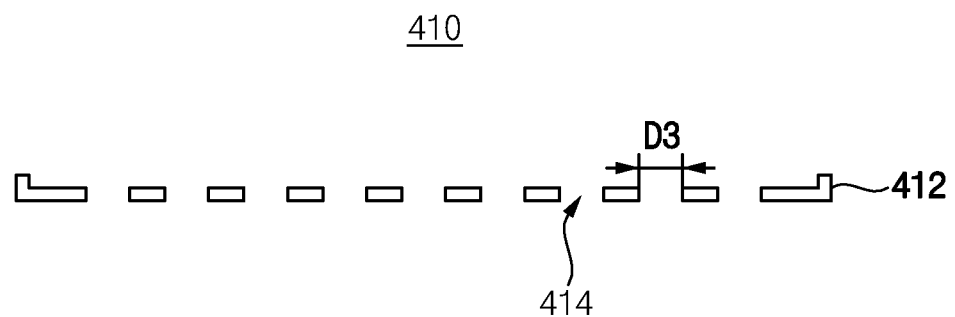
FIG. 14 is a cross-sectional view taken along the line E-E' in FIG. 13, according to an example embodiment.
Figure 15:
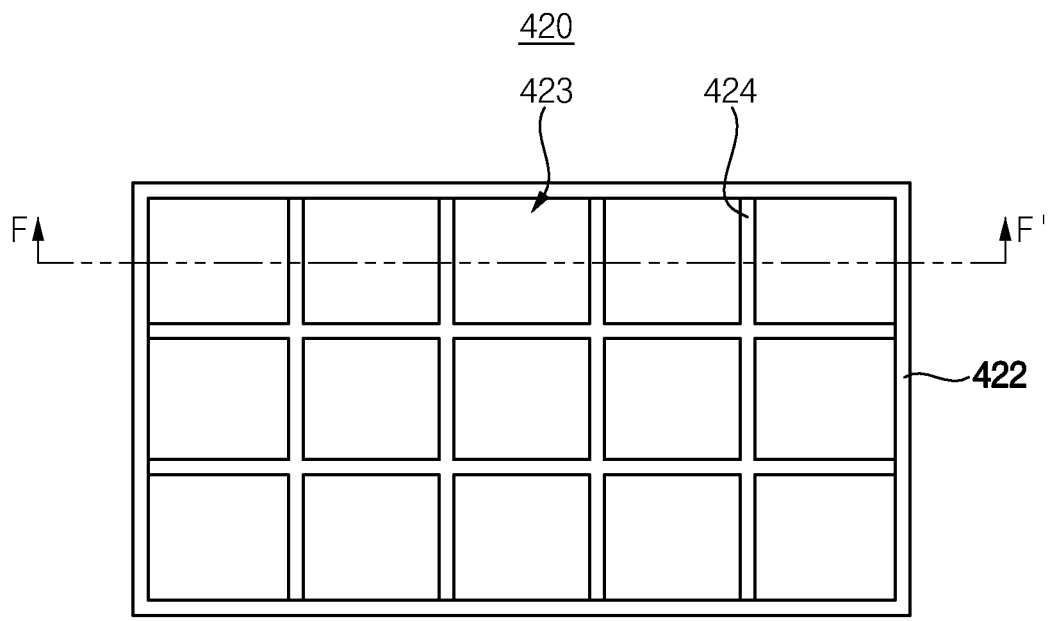
FIG. 15 is a plan view illustrating an upper jig of the fixing jig in FIG. 12, according to an example embodiment.
Figure 16:
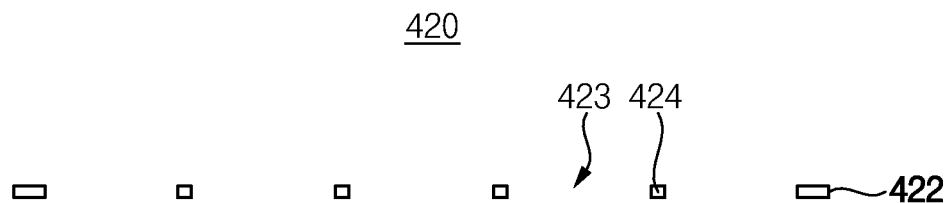
FIG. 16 is a cross-sectional view taken along the line F-F' in FIG. 15, according to an example embodiment.
Figure 17:
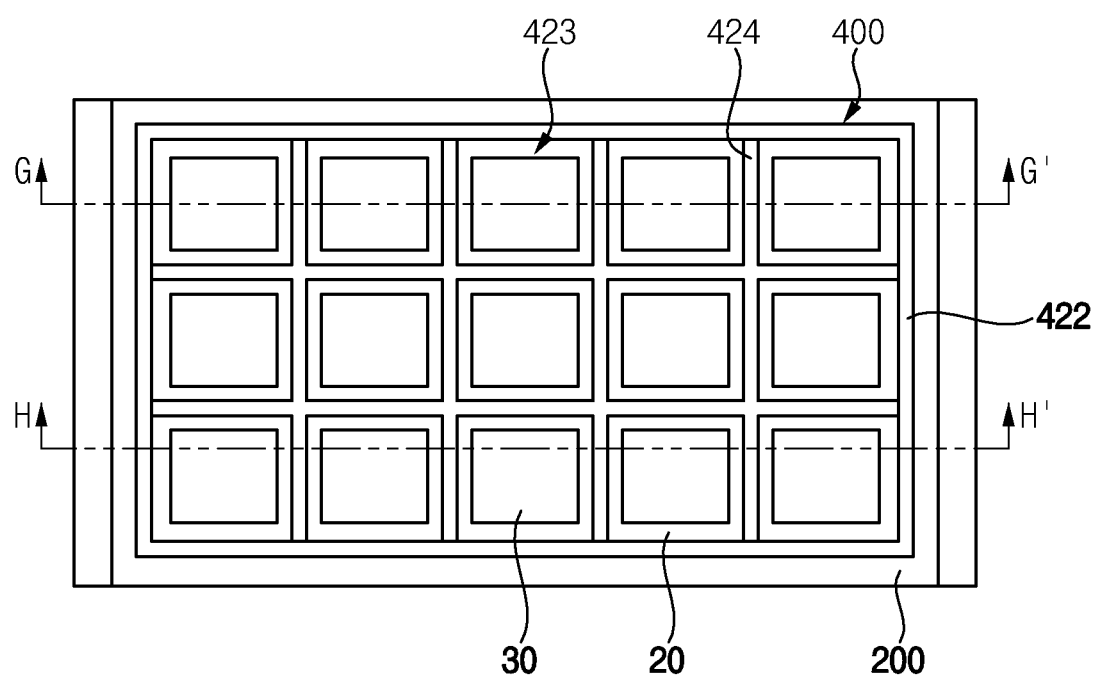
FIG. 17 is a plan view illustrating the fixing jig supported on a substrate stage of the solder reflow apparatus of FIG. 12, according to an example embodiment.
Figure 18:
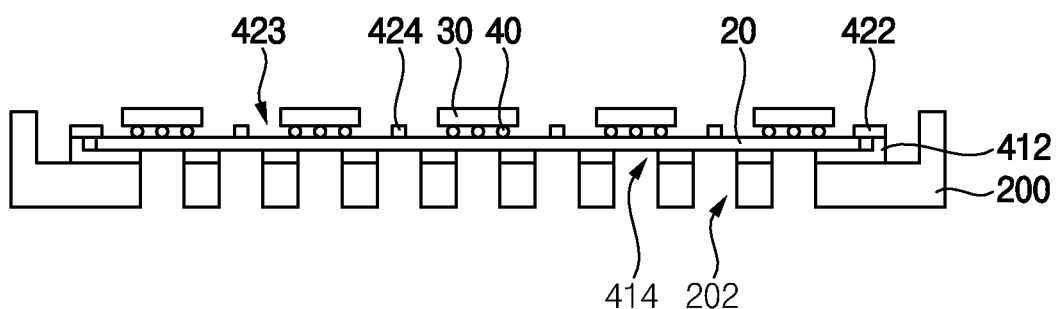
FIG. 18 is a cross-sectional view taken along the line G-G' in FIG. 17, according to an example embodiment.
Figure 19:
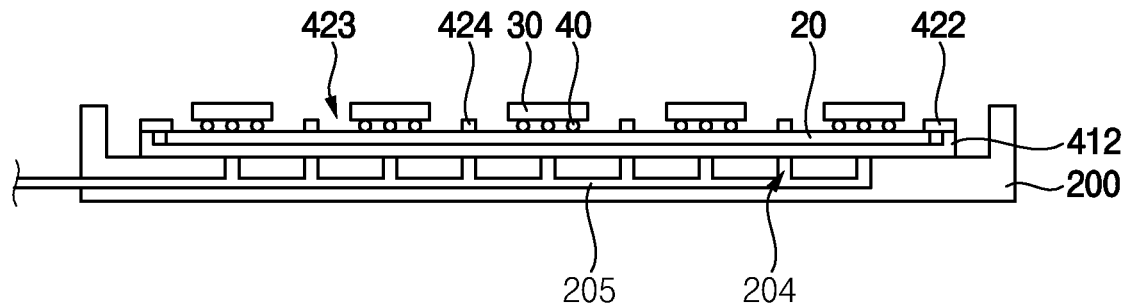
FIG. 19 is a cross-sectional view taken along the line H-H' in FIG. 17, according to an example embodiment.

FIG. 12 is a cross-sectional view illustrating a solder reflow apparatus in accordance with example embodiments. FIG. 13 is a plan view illustrating a lower jig of a fixing jig loaded into the solder reflow apparatus of FIG. 12 according to an example embodiment. FIG. 14 is a cross-sectional view taken along the line E-E' in FIG. 13 according to an example embodiment. FIG. 15 is a plan view illustrating an upper jig of the fixing jig in FIG. 12 according to an example embodiment. FIG. 16 is a cross-sectional view taken along the line F-F' in FIG. 15 according to an example embodiment. FIG. 17 is a plan view illustrating the fixing jig supported on a substrate stage 200 of the solder reflow apparatus of FIG. 12 according to an example embodiment. FIG. 18 is a cross-sectional view taken along the line G-G' in FIG. 17 according to an example embodiment. FIG. 19 is a cross-sectional view taken along the line H-H' in FIG. 17, according to an example embodiment. The solder reflow apparatus according to the example embodiment shown in FIG. 12 may be substantially the same as or similar to the solder reflow apparatus described with reference to the example embodiment of FIG. 1, except for an additional fixing jig. Thus, same reference numerals will be used for the same or like elements and any further repetitive explanation concerning the above elements will be omitted.

Referring to FIGS. 12, 13, 14, 15, 16, 17, 18 and 19, according to an example embodiment, a solder reflow apparatus 11 may include a vapor generating chamber 100, a heater 110, a substrate stage 200 and a fixing jig 400 supported on a seating surface 201 of the substrate stage 200.

In example embodiments, the fixing jig 400 may be mounted on the substrate 20 to press and fix the substrate 20 of the article S. In a state in which the substrate 20 is pressurized and fixed, the fixing jig 400 may be supported on the seating surface 201 of the substrate stage 200.

As illustrated in FIGS. 13, 14, 15, and 16, according to an example embodiment, the fixing jig 400 may include a lower jig 410 and an upper jig 420 fixed on the lower jig 410. The lower jig 410 may include a lower base plate 412 on which the substrate 20 is seated and through which second vapor passage holes 414 are formed. The upper jig 420 may be fixedly disposed on the lower jig 410 to press the substrate 20. The upper jig 420 and the lower jig 410 may be coupled to each other by a fastener including, but not limited to, a magnetic material.

The lower base plate 412 may include a mesh-type support structure having the second vapor passage holes 414. The upper jig 420 may have an edge portion 422 that presses a peripheral region of the substrate 20 and pressure ribs 424 that extend inwardly from the edge portion 422 to form a window 423 exposing the electronic component 30 on the substrate 20. The pressing ribs 424 may extend along a cutting region of the substrate 20 when the substrate 20 is supported on the lower jig 410.

As illustrated in FIGS. 17, 18 and 19, according to an example embodiment, while the article S to be soldered is pressed and fixed by the fixing jig 400, the fixing jig 400 may be supported on the seating surface 201 of the substrate stage 200. A lower surface of the substrate 20 may be exposed by the second vapor passage holes 414 that penetrate the lower base plate 412. The second vapor passage holes 414 of the lower jig 410 may be in communication with the vapor passage holes 202 of the lower substrate stage 200 respectively. The second vapor passage hole 414 may have a diameter D3 of a third size the same as the diameter D1 of the vapor passage holes 202.

The lower surface of the lower jig 410 may come into contact with the suction holes 204 opened in the seating surface 201. When the vacuum pump 308 sucks air from the suction holes 204, the lower jig 410 of the fixing jig 400 may be suction-supported on the seating surface 201 by at least partial vacuum formed in the suction holes 204. At this time, vapor under the substrate stage 200 may pass through the vapor passage holes 202 of the substrate stage 200 and the second vapor passage hole 414 of the lower jig 410 to come into contact with the lower surface of the substrate 20. Accordingly, the vapor may be sufficiently supplied through the lower surface of the substrate 20 to achieve more uniform heat transfer over the entire area of the article S.

Hereinafter, a method of manufacturing an electronic device using the solder reflow apparatus of FIG. 1 will be described, according to an example embodiment. A case in which the electronic device is a semiconductor package will be described. However, it will be understood that the manufacturing method of the electronic device in accordance with example embodiments is not limited thereto.

Figure 20:
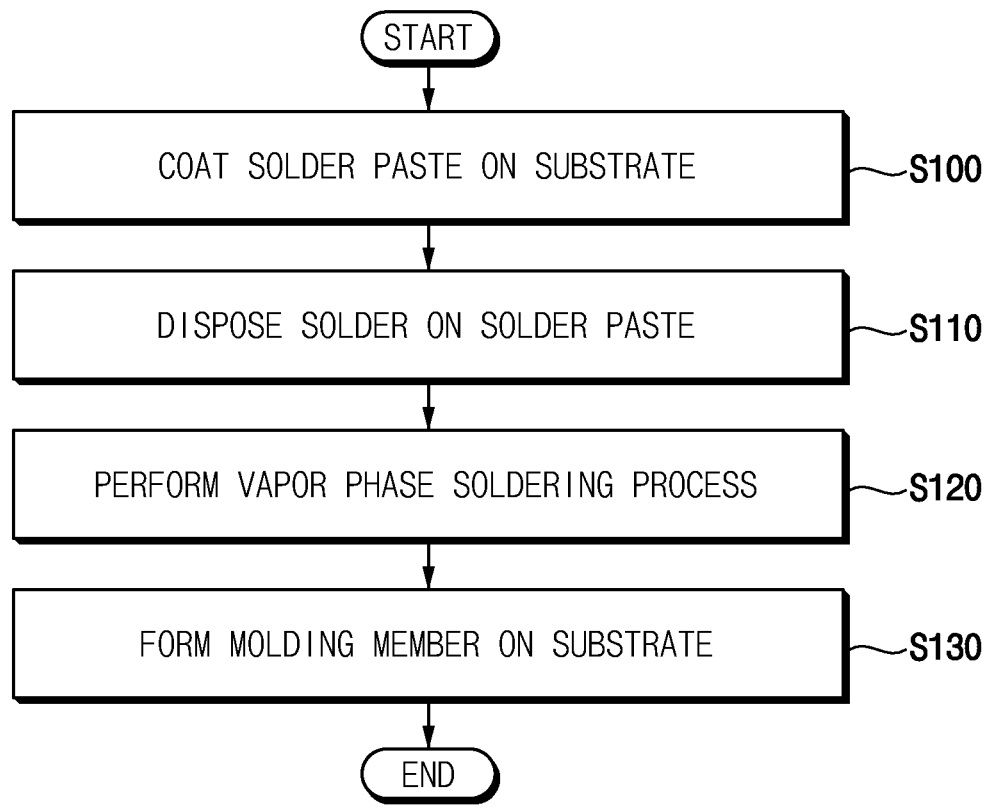
FIG. 20 is a flowchart illustrating a method of manufacturing an electronic device in accordance with example embodiments.
Figure 21:
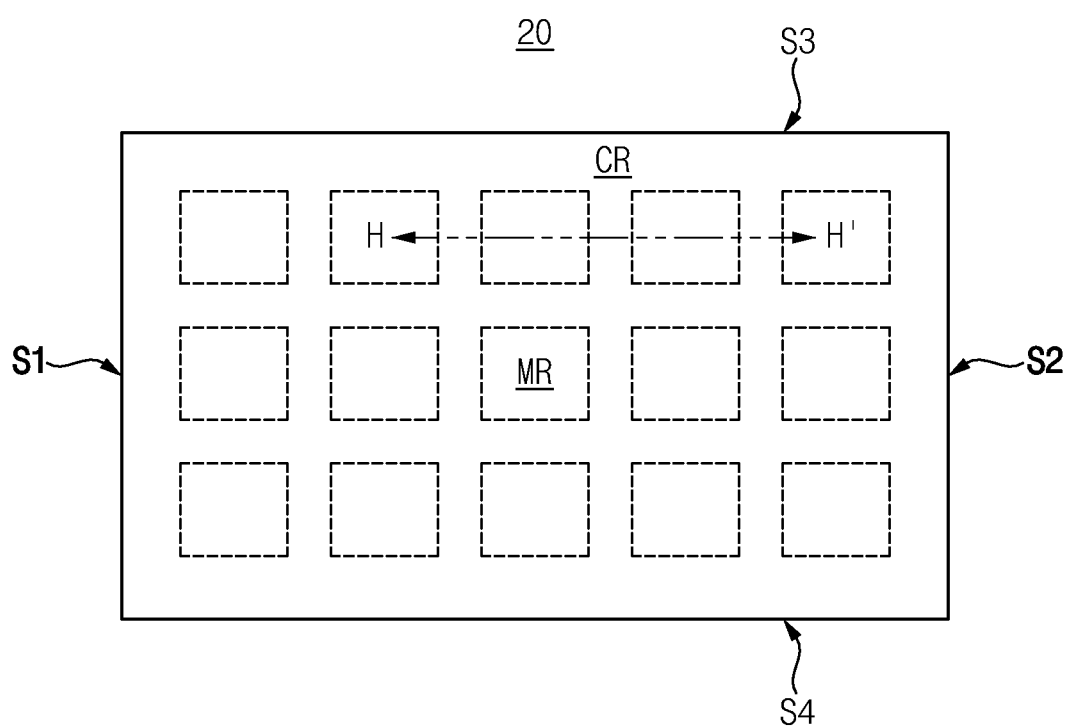
FIGS. 21, 22, 23, 24, 25, 26 and 27 are views illustrating a method of manufacturing an electronic device in accordance with example embodiments.

FIG. 20 is a flowchart illustrating a method of manufacturing an electronic device in accordance with example embodiments. FIGS. 21, 22, 23, 24, 25, 26 and 27 are views illustrating a method of manufacturing an electronic device in accordance with example embodiments. FIG. 21 is a plan view illustrating a strip substrate on which semiconductor chips are mounted according to an example embodiment. FIGS. 22, 24, 25 and 26 are cross-sectional views taken along the line H-H' in FIG. 21 according to an example embodiment.

Referring to FIGS. 20, 21, 22, 23, 24, 25, 26 and 27, according to an example embodiment, first, a substrate 20 including a plurality of substrate pads 22 may be provided, a solder paste 24 may be coated on the substrate pads 22 of the substrate 20 (S100), and a solder 40 may be disposed on the solder paste 24 (S110).

As illustrated in FIG. 21, according to an example embodiment, the substrate 20 may comprise a multilayer circuit board as a package substrate having an upper surface and a lower surface opposite to each other. The substrate 20 may be a strip substrate for manufacturing a semiconductor strip including, but not limited to, a printed circuit board (PCB).

The substrate 20 may have first and second side portions S1 and S2 extending in a direction parallel to a second direction (Y direction) parallel to the upper surface and facing each other, and third side portions S3 and S4 extending in a direction parallel to a first direction (X direction) perpendicular to the second direction and facing each other. When viewed from a plan view, the substrate 20 may have a quadrangular shape. The substrate 20 may have a predetermined area (e.g., 77.5 mm×240 mm).

The substrate 20 may include a mounting region MR on which a semiconductor chip is mounted and a cutting region CR surrounding the mounting region MR. A plurality of electronic components 30 may be disposed on the mounting regions MR of the substrate 20 respectively. For example, tens to hundreds of electronic components 30 may be arranged in a matrix form on the substrate 20.

Figure 22:
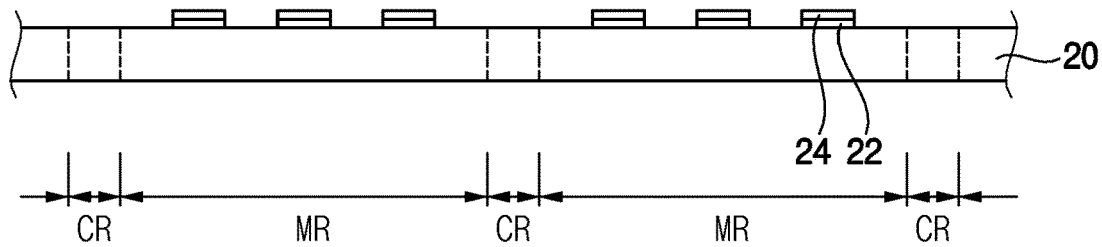

As illustrated in FIG. 22, according to an example embodiment, the solder paste 24 may be coated on each of the plurality of substrate pads 22 of the substrate 20. A pitch between the substrate pads 22 of the substrate 20 may be within a range of several tens of microns.

The solder paste 24 may be printed onto the substrate pads 22 of substrate 20. For example, the solder paste 24 may be printed by a stencil printer, or the like. A stencil may be a metal foil having a plurality of openings corresponding to an array of solders that are subsequently placed. During printing, the solder paste 24 may be printed to fill the openings of the stencil. The solder paste 24 may include, but is not limited to, solder power and flux. The flux may include, but is not limited to, resin, solvent, activator, antioxidant, etc.

Alternatively, the solder paste may be coated to a surface of the solder 40 formed on the semiconductor chip 30.

Figure 23:
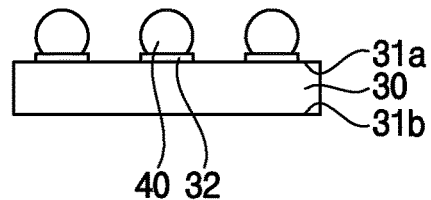

As illustrated in FIG. 23, according to an example embodiment, the solder 40 may be formed on the electronic component 30 mounted on the substrate 20. The electronic component 30 may be a semiconductor chip. Alternatively, the electronic component may be a semiconductor package. In this case, the substrate 20 may be a module board.

A plurality of input/output pads 32 may be formed on a first surface 31a of the electronic component 30. The solders 40 may be respectively formed on the input/output pads 32. After forming an under bump metal (UBM) on the input/output pad 32, the solder 40 may be formed on the under bump metal.

Figure 24:
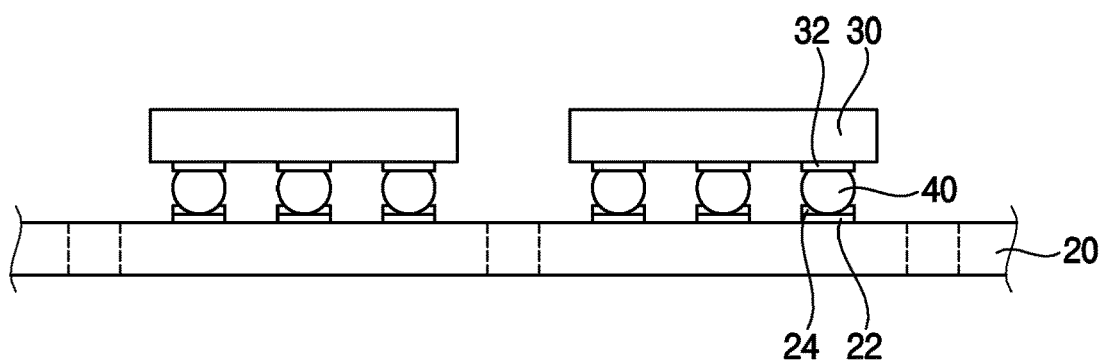

As illustrated in FIG. 24, according to an example embodiment, the electronic component 30 may be disposed on the substrate 20 such that the solder 40 is interposed between the input/output pad 32 of the electronic component 30 and the solder paste 24. The semiconductor chips may be mounted on the substrate 20 by a flip chip bonding method.

Then, a vapor phase reflow soldering may be performed (S120).

Figure 25:
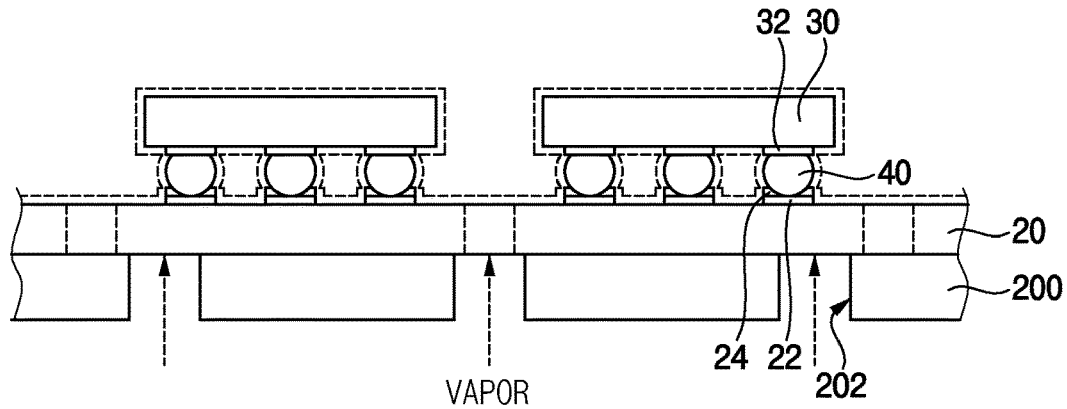

Referring to FIG. 25, according to an example embodiment, the substrate 20 on which the electronic component 30 is mounted may be loaded into the vapor generating chamber 100 of the solder reflow apparatus 10 of the example embodiment of FIG. 1, and while the substrate 20 is sequentially moved in the vertical direction within the vapor generating chamber 100, the heat transfer fluid F in a vapor state may be brought into contact with the surface of the substrate 20 to heat the solder paste 24, thereby reflowing the solder 40 and thus, a solder bump may be formed between the substrate pad 22 and the input/output pad 32.

In example embodiments, the article S may be loaded onto the substrate stage 200, the vacuum pump 308 may be connected to the suction holes 204 by the exhaust line 205 to form at least partial vacuum in the suction holes 204. When the vacuum pump 308 sucks air from the suction holes 204, the substrate 20 may be suction-supported on the seating surface 201 by at least partial vacuum formed in the suction holes 204.

After the article S is suction-supported on the substrate stage 200, the Galden solution of the transfer fluid F may be heated by the heater 110 and start to boil. The saturated vapor from the Galden solution may be distributed within the space 101 of the vapor generating chamber 100. At this time, the vapor may have a density gradient according to the height, and thus, a temperature gradient along the vertical direction within the vapor generating chamber 100 may be formed.

After the article S is preheated at the third height H3, the article may be moved to the second height H2 and activated (soaked). The substrate 20 may be preheated to prevent various soldering defects and to provide a more solid and conductive joint. There may be a secondary vapor phase which is produced at a cooler temperature than the main vapor layer at the third and second heights H3 and H2. No soldering takes place at the second height H2, but a temperature increases at the second height H2 compared to the third height H3.

The article S may be moved to the first height H1 so that the solder 40 may be reflowed. When the article S is immersed in the vapor at the first height H1, the vapor may serve as a heat transfer medium. Because the temperature of the vapor and the temperature of the substrate 20 at the first height H1 are different from each other, vapor may be condensed on a surface of the article S to form a layer. The vapor condensing on the surface may transfer latent heat to the surface of the substrate 20 during condensation to reflow a solder paste.

At this time, the vapor under the substrate stage 200 may move through the openings of the substrate stage 200 and vapor passage holes of the substrate 20 to be supplied to the solder 40 and the surroundings of the solder 40. Accordingly, the vapor may be sufficiently supplied to regions adjacent to the vapor passage holes of the substrate 20 to achieve more uniform heat transfer over the entire area of the article S.

Then, after the solder 40 is soldered, the article S may be moved to the top of the chamber and then may be cooled. Accordingly, the solder joints may be cooled down and solidified.

Figure 26:
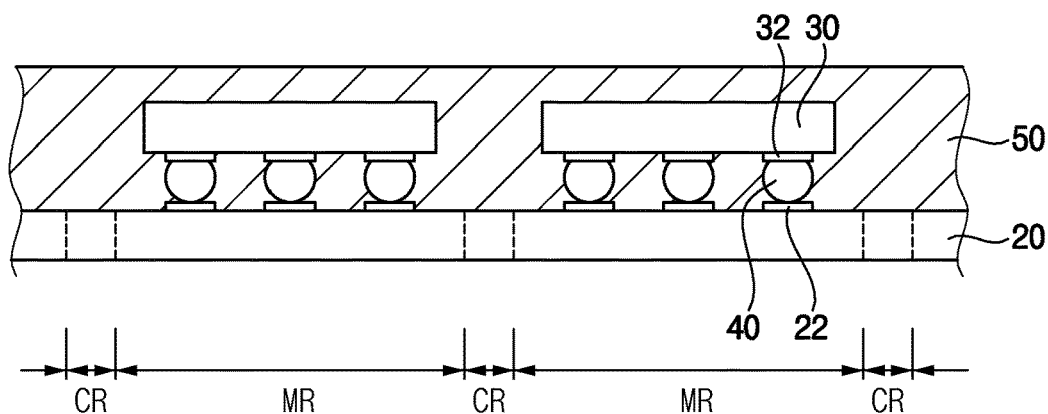

Referring to FIG. 26, according to an example embodiment, a molding member 50 may be formed on the substrate 20 to cover the electronic components 30 (S130).

In example embodiments, the molding member 50 may be formed on the substrate 20 by a transfer molding apparatus. The substrate 20 may be disposed in a molding space of a mold of the molding apparatus, and a sealing material may flow at high temperature and under high pressure when a lower mold and an upper mold are clamped, so that the liquid sealing material flows inside the molding space and is solidified to form the molding member covering the electronic components 30. For example, the sealing material may include, but is not limited to, an epoxy mold compound (EMC).

Figure 27:
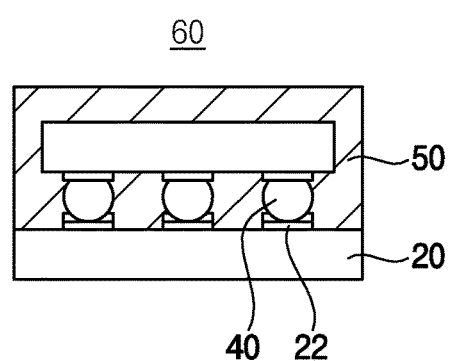

Referring to FIG. 27, according to an example embodiment, the substrate 20 may be sawed by a sawing process to complete semiconductor packages.

In example embodiments, external connection members including, but not limited to, solder balls may be formed on outer connection pads on a lower surface of the substrate 20, and the cutting region CR of the substrate 20 may be removed by a cutting device including, but not limited to, a blade. Accordingly, the semiconductor packages may be individualized from the substrate 20.

Through the above processes, a semiconductor package including a logic device or a memory device and a semiconductor module including the same may be manufactured. The semiconductor package may include, but is not limited to, logic devices including, but not limited to, central processing units (CPUs), main processing units (MPUs), or application processors (APs), or the like, and volatile memory devices including, but not limited to, DRAM devices, HBM devices, or non-volatile memory devices including, but not limited to, flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope as defined by the following claims.

What is claimed is:

1. A solder reflow apparatus comprising:
a vapor generating chamber configured to accommodate a heat transfer fluid and to accommodate saturated vapor generated by heating the heat transfer fluid;
a heater configured to heat the heat transfer fluid accommodated in the vapor generating chamber;

a substrate stage configured to be movable upward and downward within the vapor generating chamber, the substrate stage comprising a seating surface;

vapor passages penetrating the substrate stage and configured to allow the vapor to move therethrough; and suction passages penetrating the substrate stage to be open to the seating surface and in which at least a partial vacuum is generated.

2. The solder reflow apparatus of claim 1, wherein each of the vapor passages has a first diameter, and wherein each of the suction passages has a second diameter that is smaller than the first diameter.

3. The solder reflow apparatus of claim 1, further comprising:

an exhaust line extending within the substrate stage to be in communication with the suction passages.

4. The solder reflow apparatus of claim 3, further comprising:

a vacuum pump connected to the exhaust line and configured to form the partial vacuum in the suction passages.

5. The solder reflow apparatus of claim 4, further comprising:

an expandable pipe disposed in the vapor generating chamber and connecting the exhaust line to the vacuum pump.

6. The solder reflow apparatus of claim 1, wherein the heat transfer fluid comprises a Galden solution.

7. The solder reflow apparatus of claim 1, further comprising:

a fixing jig supported on the seating surface of the substrate stage and configured to support a substrate on which an electronic component is mounted via a solder.

8. The solder reflow apparatus of claim 7, wherein the fixing jig comprises:

a lower jig on which the substrate is seated, the lower jig comprising second vapor passages that correspond to the vapor passages respectively; and an upper jig fixedly disposed on the lower jig and configured to press the substrate.

9. The solder reflow apparatus of claim 8, wherein the upper jig further comprises:

an edge portion configured to press a peripheral region of the substrate; and pressure ribs extending inwardly from the edge portion to form a window that exposes the electronic component on the substrate.

10. The solder reflow apparatus of claim 7, wherein the substrate comprises a package substrate, and wherein the electronic component comprises a semiconductor chip.

11. A solder reflow apparatus comprising:

a vapor generating chamber configured to accommodate a heat transfer fluid;

a heater configured to heat the heat transfer fluid to generate saturated vapor from the heat transfer fluid;

a substrate stage configured to be movable upward and downward within the vapor generating chamber, the substrate stage comprising a seating surface that is configured to support a substrate on which an electronic component is mounted via a solder;

vapor passages penetrating the substrate stage; and a suction support mechanism comprising:

suction passages penetrating the substrate stage to be open to the seating surface; and a vacuum pump configured to generate at least a partial vacuum in the suction passages.

12. The solder reflow apparatus of claim 11, wherein the suction support mechanism further comprises:

an exhaust line extending within the substrate stage and in communication with the suction passages.

13. The solder reflow apparatus of claim 12, wherein the suction support mechanism further comprises an expandable pipe disposed in the vapor generating chamber and connecting the exhaust line to the vacuum pump.

14. The solder reflow apparatus of claim 11, wherein each of the vapor passages has a first diameter, and wherein each of the suction passages has a second diameter that is smaller than the first diameter.

15. The solder reflow apparatus of claim 11, further comprising:

a fixing jig supported on the seating surface of the substrate stage and configured to support the substrate.

16. The solder reflow apparatus of claim 15, wherein the fixing jig comprises:

a lower jig on which the substrate is seated, the lower jig comprising second vapor passages that correspond to the vapor passages respectively; and an upper jig fixedly disposed on the lower jig and configured to press the substrate.

17. The solder reflow apparatus of claim 16, wherein the upper jig further comprises:

an edge portion configured to press a peripheral region of the substrate; and pressure ribs extending inwardly from the edge portion to form a window that exposes the electronic component on the substrate.

18. The solder reflow apparatus of claim 11, wherein the substrate comprises a package substrate, and wherein the electronic component comprises a semiconductor chip.

19. The solder reflow apparatus of claim 11, further comprising:

transfer rods supporting end portions of the substrate stage; and an actuator configured to move the substrate stage upward and downward along the transfer rods.

20. A solder reflow apparatus comprising:

a vapor generating chamber configured to accommodate a heat transfer fluid and to accommodate saturated vapor generated by heating the heat transfer fluid is heated;

a heater configured to heat the heat transfer fluid accommodated in the vapor generating chamber;

a substrate stage configured to be movable upward and downward within the vapor generating chamber, the substrate stage comprising:

a seating surface;

vapor passages penetrating the substrate stage and configured to allow the vapor to move through the vapor passages; and suction passages extending in the substrate stage to be open to the seating surface; and a fixing jig supported on the seating surface of the substrate stage and configured to support a substrate on which an electronic component is mounted via a solder.

* * * * *